(12) United States Patent
Tang et al.

(10) Patent No.: US 10,733,129 B2
(45) Date of Patent: Aug. 4, 2020

(54) COMPENSATING DC LOSS IN USB 2.0 HIGH SPEED APPLICATIONS

(71) Applicant: TEXAS INSTRUMENTS INCORPORATED, Dallas, TX (US)

(72) Inventors: Yonghui Tang, Plano, TX (US); Yanli Fan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/967,883

(22) Filed: May 1, 2018

(65) Prior Publication Data

US 2019/0213158 A1 Jul. 11, 2019

Related U.S. Application Data

(60) Provisional application No. 62/616,201, filed on Jan. 11, 2018.

(51) Int. Cl.
| | |
|---|---|
| G06F 13/36 | (2006.01) |
| G06F 13/38 | (2006.01) |
| G06F 13/40 | (2006.01) |
| G06F 13/42 | (2006.01) |
| H03K 5/24 | (2006.01) |
| H03K 5/1534 | (2006.01) |

(52) U.S. Cl.
CPC ...... *G06F 13/4022* (2013.01); *G06F 13/4063* (2013.01); *G06F 13/4282* (2013.01); *G06F 13/4295* (2013.01); *G06F 2213/0042* (2013.01); *H03K 5/1534* (2013.01); *H03K 5/24* (2013.01)

(58) Field of Classification Search
CPC .......... G06F 13/36; G06F 13/38; G06F 13/40
See application file for complete search history.

(56) References Cited

U.S. PATENT DOCUMENTS

| 7,394,281 | B1* | 7/2008 | Bandholz | ............ | G06F 13/4072 |
| | | | | | 326/22 |
| 2008/0301347 | A1* | 12/2008 | Bandholz | ............ | G06F 13/4072 |
| | | | | | 710/305 |
| 2009/0033365 | A1* | 2/2009 | Miura | ................ | H04L 25/0282 |
| | | | | | 326/82 |
| 2011/0221521 | A1* | 9/2011 | Razzell | .................. | H04B 3/06 |
| | | | | | 330/69 |
| 2016/0267044 | A1* | 9/2016 | Wu | ..................... | G06F 13/4282 |

OTHER PUBLICATIONS

Rivetti1, "Analog Design in Deep Submicron CMOS Processes for LHC", 1999, p. 2 as found in https://www.semanticscholar.org/paper/Analog-design-in-deep-submicron-CMOS-processes-for-Rivetti-Marchioro/4e08c57d9e7ab54777767227c12ed9293a4b8f92.*

(Continued)

*Primary Examiner* — David E Martinez
(74) *Attorney, Agent, or Firm* — Ebby Abraham; Charles A. Brill; Frank D. Cimino

(57) ABSTRACT

In one embodiment, a current source is coupled to a channel input of a switch, and an output of the switch is coupled to a positive or negative data line in a USB 2.0 communication system. In addition, a first input of the voltage threshold comparator is coupled to the negative data line, a second input of the voltage threshold comparator is coupled to a positive data line, and an output of the voltage threshold comparator is coupled to a control input of the switch.

7 Claims, 3 Drawing Sheets

(56) References Cited

OTHER PUBLICATIONS

High Speed Eye; High Speed Speed Signal Quality; "Test USB"; USB 2.0 Specification, Section 7.1.2.2; http://testusb.com/HSEYE.htm; Jan. 10, 2018; 2 pages.

"Eye Diagram Basics: Reading and applying eye diagrams"; EDN Moment: https://www.edn.com/design/test-and-measurement/4389368/Eye-Diagram-Basics-Reading-and-applying-eye diagrams; Jan. 10, 2018; 7 pages.

"Understanding Data Eye Diagram Methodology for Analyzing High Speed Digital Signals" AND9075/D; ON Semiconductor; Semiconductor Components Industries, LLC,; www.onsemi.com; Jun. 2015, Rev.1; 7 pages.

\* cited by examiner

COMPENSATING DC LOSS IN USB 2.0 HIGH SPEED APPLICATIONS

PRIORITY

This application claims the benefit, under 35 U.S.C. § 119(e), of U.S. Provisional Patent Application No. 62/616, 201, filed 11 Jan. 2018, which is incorporated herein by reference.

TECHNICAL FIELD

This disclosure generally relates to compensating direct current ("DC") loss, and in particular compensating DC loss in a USB 2.0 system.

BACKGROUND

Many modern day applications (e.g., vehicle infotainment systems) use USB 2.0 data transmissions. Moreover, these USB 2.0 systems are becoming more complicated especially with the introduction of additional components (e.g., USB cable, PCB trace, signal switches, etc.) in USB 2.0 systems. However, the introduction of these additional components has led to a direct current ("DC") loss in the data transmission with a shrinking eye height as these components introduce additional resistance to the data path. In certain situations, the DC loss causes the signal to fail the eye diagram compliance test for USB 2.0.

Conventionally, USB 2.0 hubs attempt to alleviate this issue by repeating the signals between USB 2.0 host and device. However, these USB 2.0 hubs are intrusive as the hubs break the transmission line, require a large amount of power, and must understand and repeat the signal. Moreover, because of its uni-directional nature, USB 2.0 hubs may not fully support the USB On-The-Go and Embedded Host Supplement to the USB 2.0 Specification as this supplement provides for a host and device to interchange roles.

SUMMARY OF PARTICULAR EMBODIMENTS

This disclosure uses a transition detection mechanism to detect the start-stop of the data transition period. A current is injected into the "high" level signal during the non-transition period so as to raise the DC level of the "high" signal. It will help a failed USB 2.0 system due to shrinking eye height pass the system eye diagram compliance test.

The disclosure may present several technical advantages. Technical advantages of the DC loss compensation circuit may include a current-boosting system that is simple to implement, inherently power-efficient, and direction agnostic. Moreover, the DC loss compensation circuit may help maintain signal integrity for signals communicated between two components in a USB 2.0 system. In addition, the DC loss compensation circuit provides flexibility to adjust the parameters to accommodate a wide range of USB 2.0 system applications. In addition, the DC loss compensation circuit may be compatible with the USB On-The-Go and Embedded Host Supplement to the USB 2.0 Specification.

Other technical advantages of the present disclosure will be readily apparent to one skilled in the art from the following figures, descriptions, and claims. Moreover, while specific advantages have been enumerated above, various embodiments may include all, some, or none of the enumerated advantages.

Moreover, the embodiments disclosed herein are only examples, and the scope of this disclosure is not limited to them. Particular embodiments may include all, some, or none of the components, elements, features, functions, operations, or steps of the embodiments disclosed above. Embodiments according to the invention are in particular disclosed in the attached claims, wherein any feature mentioned in one claim category, e.g. method, can be claimed in another claim category, e.g. system, as well.

BRIEF DESCRIPTION OF THE DRAWINGS

Aspects of the disclosure may be implemented in certain parts, steps, and embodiments that will be described in detail in the following description and illustrated in the accompanying drawings in which like reference numerals indicate similar elements. It will be appreciated with the benefit of this disclosure that the steps illustrated in the accompanying figures may be performed in other than the recited order and that one or more of the steps disclosed may be optional. It will also be appreciated with the benefit of this disclosure that one or more components illustrated in the accompanying figures may be positioned in other than the disclosed arrangement and that one or more of the components illustrated may be optional.

DESCRIPTION OF EXAMPLE EMBODIMENTS

Existing USB 2.0 hubs may be problematic. For example, USB 2.0 hubs are intrusive as the hubs break the transmission line. As another example, USB 2.0 hubs require a large amount of power to operate. As a third example, USB 2.0 hubs are complex and require the hubs to understand and repeat the signal. As a fourth example, USB 2.0 hubs are uni-directional and cannot support the USB On-The-Go and Embedded Host Supplement to the USB 2.0 Specification.

The DC loss compensation circuit, on the other hand, helps rectify the DC loss occurring over the transmission line by boosting signals in both directions of a USB 2.0 system. The DC loss compensation circuit detects a start and stop in a data transition period, and injects current during the non-transition period to boost the DC level of the signal. In particular, a current source is coupled through a switch to a positive or negative data line in a USB 2.0 communication system. In addition, a first input of the voltage threshold comparator is coupled to the negative data line, a second input of the voltage threshold comparator is coupled to a positive data line, and an output of the voltage threshold comparator is coupled to a control input of the switch.

Figure 1:
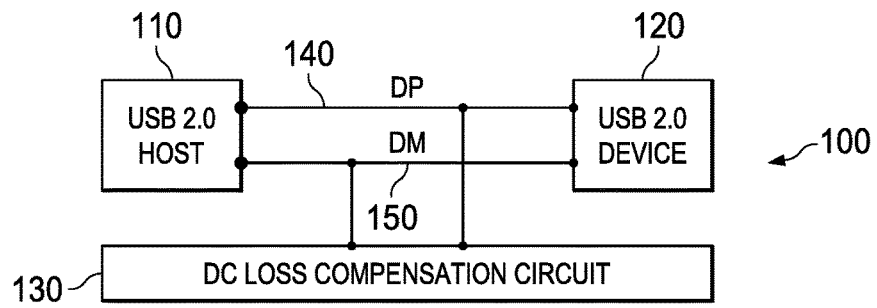
FIG. 1 illustrates an exemplary USB 2.0 system incorporating direct current ("DC") loss compensation circuit 130.

FIG. 1 illustrates exemplary USB 2.0 system 100 incorporating direct current ("DC") loss compensation circuit 130. USB 2.0 system 100 may include USB 2.0 host 110, USB 2.0 device 120, and DC loss compensation circuit 130. Positive data line ("DP") 140 and negative data line ("DM") 150 may carry current-based signals between USB 2.0 host 110 and USB 2.0 device 120.

USB 2.0 host 110 is a USB 2.0 specification compliant device that initiates all communication on DP 140 and DM 150. Example USB 2.0 host 110 may include personal computers, tablets, smartphones or any other component/device that can initiate communication under the USB 2.0 specification.

USB 2.0 device 120 is a USB 2.0 specification compliant device that may interact with USB 2.0 host 110 using DP 140 and/or DM 150. Example USB 2.0 device 120 may include USB thumb drives, external hard drives, USB Wi-Fi adaptors, and any other component/device that can communicate with USB 2.0 host 110. In certain embodiments, USB 2.0 system 100 may incorporate multiple USB 2.0 devices 120 that may communicate with USB 2.0 host 110 across DP 140 and DM 150.

DC loss compensation circuit 130 is a circuit that supplies current to DP 140 or DM 150 during non-transition periods of communication between USB 2.0 host 110 and USB 2.0 device 120. DC loss compensation circuit 130 may be direction agnostic when supplying current to DP 140 and/or DM 150. In being direction agnostic, DC loss compensation circuit 130 may also support the USB On-The-Go and Embedded Host Supplement to the USB 2.0 Specification that allows for USB 2.0 host 110 and USB 2.0 device 120 to interchange roles. In certain embodiments, USB 2.0 system 100 may incorporate multiple DC loss compensation circuits 130. In addition, DC loss compensation circuit 130 may be easily incorporated into an existing USB 2.0 system design as DC loss compensation circuit 130 does not require breaking the transmission lines DP 140 and DM 150.

DP 140 is a communication line that runs between the positive data terminal in USB 2.0 host 110 and the positive data terminal in USB 2.0 device 120. DP 140 along with DM 150 combine to form a differential pair that carries data transfers between USB 2.0 host 110 and USB 2.0 device 120. Accordingly, the signal transferred across DP 140 is complementary to the signal transferred across DM 150. Resistive components in DP 140 (e.g., USB cable, PCB trace, signal switches) may create DC loss in data transmission, which can lead to a shrinking eye height in the eye diagram. A shrinking eye height may result failure in eye diagram compliance test of the USB 2.0 system.

DM 150 is a communication line that runs between the negative data terminal in USB 2.0 host 110 and the negative data terminal in USB 2.0 device 120. DM 150 along with DP 140 combine to form a differential pair that carries data transfers between USB 2.0 host 110 and USB 2.0 device 120. Accordingly, the signal transferred across DM 150 is complementary to the signal transferred across DP 140. Resistive components in DM 150 (e.g., USB cable, PCB trace, signal switches) may create DC loss in data transmission, which can lead to a shrinking eye height in the eye diagram.

In an exemplary embodiment, DC loss compensation loss circuit 130 detects a non-transition period in a USB 2.0 signal across DP 140 and DM 150. In particular, DC loss compensation circuit 130 may detect a rising edge of the signal and a falling edge of the signal on DP 140 and DM 150. In response to detecting a non-transition period, DC loss compensation circuit 130 may inject a current into DP 140 or DM 150. In particular, DC loss compensation circuit 130 may inject a current into DP 140 between detection of a rising edge of a signal on DP 140 and the detection of a falling edge of the signal on DP 140. As another example, DC loss compensation circuit 130 may inject a current into DM 150 between detection of a rising edge of a signal on DM 150 and the detection of a falling edge of the signal on DM 150.

In certain embodiments, DC loss compensation circuit 130 does not inject current during a transition period, and, instead, grounds any potential outgoing current. The level of current during a transition period typically does not get impacted by the addition of resistive components. Moreover, to keep the signal integrity during the transition periods, DC loss compensation circuit 130 may display high impedance, thereby allowing minimal or no current into DC loss compensation circuit 130.

Figure 2:
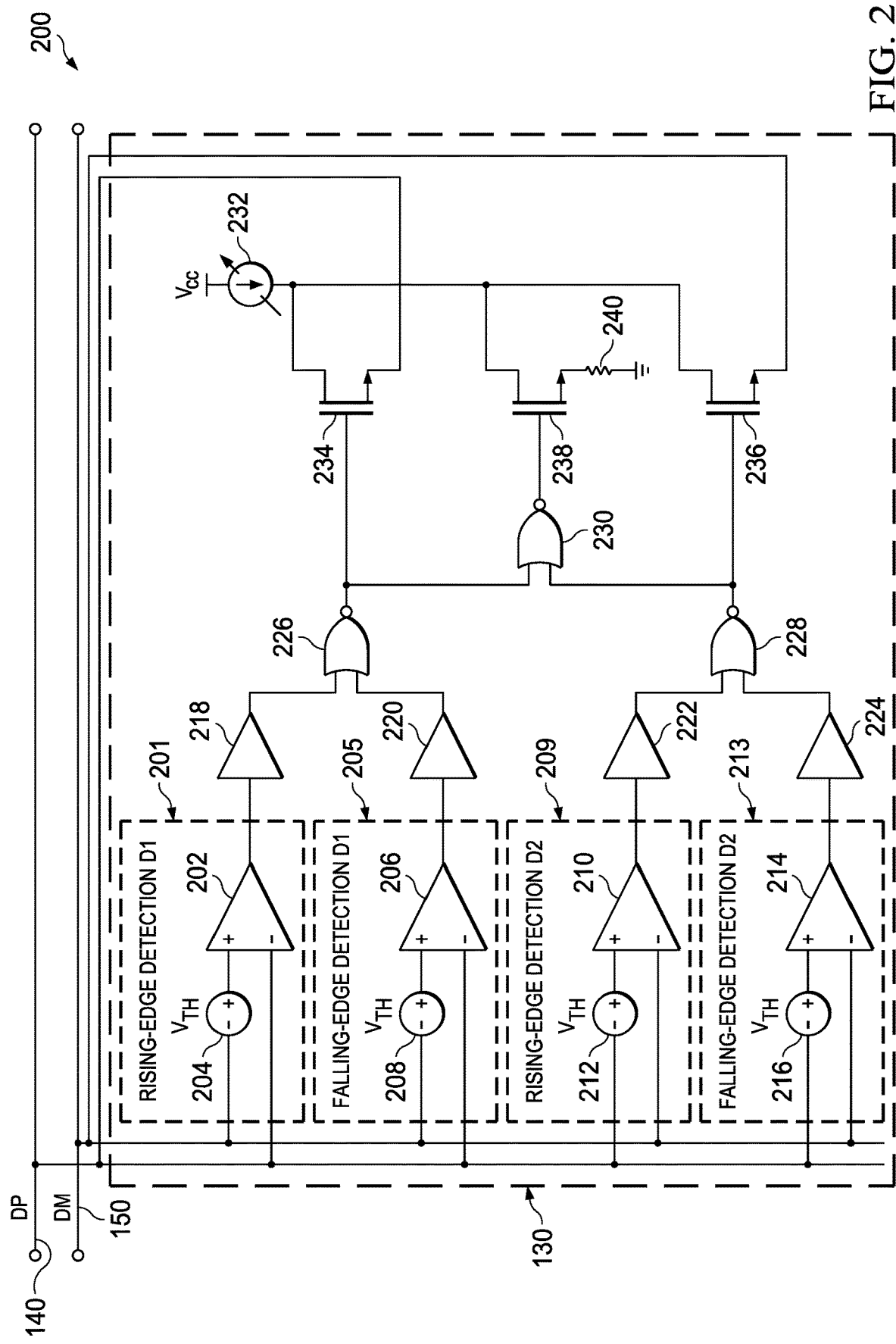
FIG. 2 illustrates an exemplary circuit diagram of a DC loss compensation circuit with a positive data line and a negative data line.

FIG. 2 illustrates exemplary circuit diagram 200 of DC loss compensation circuit 130 with DP 140 and DM 150. Circuit diagram 200 may comprise DP 140, DM 150, and DC loss compensation circuit 130. DC loss compensation circuit 130 may include first voltage threshold comparator 201 (comprising first comparator 202 with first voltage threshold source 204), second voltage threshold comparator 205 (comprising second comparator 206 with second voltage threshold source 208), third voltage threshold comparator 209 (comprising third comparator 210 with third voltage threshold source 212), fourth voltage threshold comparator 213 (comprising fourth comparator 214 with fourth voltage threshold source 216), first buffer 218, second buffer 220, third buffer 222, fourth buffer 224, first NOR gate 226, second NOR gate 228, third NOR gate 230, current source 232, first switch 234, second switch 236, third switch 238, and load resistor 240.

First voltage threshold comparator 201 may be any type of component and/or circuitry that determines whether the signal voltage at DM 150 with an additional threshold voltage is greater than and/or equal to a signal voltage at DP 140. By detecting a large-enough difference (i.e., a voltage difference equal to or above the threshold) between DM 150 and DP 140, first voltage threshold comparator 201 may be able to detect a rising edge of the signal on DP 140. If the signal voltage at DM 150 with the additional threshold voltage is greater than and/or equal to the signal voltage at DP 140, then first voltage threshold comparator 201 outputs a HIGH signal. Alternatively, if the signal voltage at DM 150 with the additional threshold voltage is not greater than and/or equal to the signal voltage at DP 140, then first voltage threshold comparator 201 outputs a LOW signal.

In the illustrated embodiment, a first input (i.e., non-inverting input) of first comparator 202 is coupled to DM 150 through first voltage threshold source 204, and a second input (i.e., inverting input) of first comparator 202 is coupled to DP 140. In particular embodiments, first comparator 202 is an operational amplifier.

First voltage threshold source 204 may be any type of component and/or circuit that introduces a voltage to the input of first comparator 202. First voltage threshold source 204 may introduce the voltage such that first comparator 202 is able to compare a signal voltage at DP 140 against a signal voltage at DM 150 with an additional threshold voltage. First voltage threshold source 204 may be adjustable, such that tolerance for which first comparator 202 detects a large enough difference to merit a change in output may be customized. In certain embodiments, first comparator 202 may inherently be able to compare a signal voltage at DP 140 against a signal voltage at DM 150 without the use of first voltage threshold source 204. The threshold in first comparator 202, in this embodiment, may be adjustable.

Likewise, second voltage threshold comparator 205 may be any type of component and/or circuitry that determines whether a signal voltage at DM 150 with an additional threshold voltage is greater than and/or equal to a signal voltage at DP 140. By detecting a large-enough difference (i.e., a voltage difference equal to or above the threshold)

between DM 150 and DP 140, second voltage threshold comparator 205 may be able to detect a falling edge of the signal on DP 140. If the signal voltage at DM 150 with the additional threshold voltage is greater than and/or equal to the signal voltage at DP 140, then second voltage threshold comparator 205 outputs a HIGH signal. Alternatively, if the signal voltage at DM 150 with the additional threshold voltage is not greater than and/or equal to the signal voltage at DP 140, then second voltage threshold comparator 205 outputs a LOW signal.

In certain embodiments, the threshold voltage for second voltage threshold comparator 205 may be different than the threshold voltage for first voltage threshold comparator 201. Moreover, in certain embodiments, first voltage threshold comparator 201 and second voltage threshold comparator 205 may exist as a single voltage threshold comparator. In this embodiment, a single comparator may detect both the rising edge and falling edge of DP 140.

In the illustrated embodiment, a first input (i.e., non-inverting input) of second comparator 206 is coupled to DM 150 through second voltage threshold source 208, and a second input (i.e., inverting input) of second comparator 206 is coupled to DP 140. In particular embodiments, second comparator 206 is an operational amplifier.

Second voltage threshold source 208 may be any type of component and/or circuit that introduces a voltage to the input of second comparator 206. In certain embodiments, second voltage threshold source 208 may be set at a different voltage than first voltage threshold source 204. Second voltage threshold source 208 may introduce the voltage such that second comparator 206 is able to compare a signal voltage at DP 140 against a signal voltage at DM 150 with an additional threshold voltage. Second voltage threshold source 208 may be adjustable, such that tolerance for which second comparator 206 detects a large enough difference to merit a change in output may be customized. In certain embodiments, second comparator 206 may inherently be able to compare the signal voltage at DP 140 against the signal voltage at DM 150 without the use of second voltage threshold source 208. The threshold in second comparator 206, in this embodiment, may be adjustable.

Third voltage threshold comparator 209 may be any type of component and/or circuitry that determines whether a signal voltage at DP 140 with an additional threshold voltage is greater than and/or equal a signal voltage at DM 150. By detecting a large-enough difference (i.e., a voltage difference equal to or above the threshold) between DP 140 and DM 150, third voltage threshold comparator 209 may be able to detect a rising edge of the signal on DM 150. If the signal voltage at DP 140 with an additional threshold voltage is greater than and/or equal to the signal voltage at DM 150, then third voltage threshold comparator 209 outputs a HIGH signal. Alternatively, if the signal voltage at DP 140 with an additional threshold voltage is not greater than and/or equal to the signal voltage at DM 150, then third voltage threshold comparator 209 outputs a LOW signal.

In the illustrated embodiment, a first input (i.e., non-inverting input) of third comparator 210 is coupled to DP 140 through third voltage threshold source 212, and a second input (i.e., inverting input) of third comparator 210 is coupled to DM 150. In particular embodiments, third comparator 210 is an operational amplifier.

Third voltage threshold source 212 may be any type of component and/or circuit that introduces a voltage to the input of third comparator 210. Third voltage threshold source 212 may introduce the voltage such that third comparator 210 is able to compare a signal voltage at DP 140 with an additional threshold voltage against a signal voltage at DM 150. Third voltage threshold source 212 may be adjustable, such that tolerance for which third comparator 210 detects a large enough difference to merit a change in output may be customized. In certain embodiments, third comparator 210 may inherently be able to compare the signal voltage at DM 150 and the signal voltage at DP 140 without the use of third voltage threshold source 212. The threshold in third comparator 210, in this embodiment, may be adjustable.

Likewise, fourth voltage threshold comparator 213 may be any type of component and/or circuitry that determines whether a signal voltage at DP 140 with an additional threshold voltage is greater than and/or equal to a signal voltage at DM 150. By detecting a large-enough difference (i.e., a voltage difference equal to or above the threshold) between DP 140 and DM 150, fourth voltage threshold comparator 213 may be able to detect a falling edge of the signal on DM 150. If the signal voltage at DP 140 with the additional threshold voltage is greater than and/or equal to the signal voltage at DM 150, then fourth voltage threshold comparator 213 outputs a HIGH signal. Alternatively, if the signal voltage at DP 140 with the additional threshold voltage is not greater than and/or equal to the signal voltage at DM 150, then fourth voltage threshold comparator 213 outputs a LOW signal.

In certain embodiments, the threshold voltage for fourth voltage threshold comparator 213 may be different than the threshold voltage for third voltage threshold comparator 209. Moreover, in certain embodiments, third voltage threshold comparator 209 and fourth voltage threshold comparator 213 may exist as a single voltage threshold comparator. In this embodiment, a single comparator may detect both the rising edge and falling edge of DM 150.

In the illustrated embodiment, a first input (i.e., non-inverting input) of fourth comparator 214 is coupled to DP 140 through fourth voltage threshold source 216, and a second input (i.e., inverting input) of fourth comparator 214 is coupled to DM 150. In particular embodiments, fourth comparator 214 is an operational amplifier.

Fourth voltage threshold source 216 may be any type of component and/or circuit that introduces a voltage to the input of fourth comparator 214. In certain embodiments, fourth voltage threshold source 216 may be set at a different voltage than third voltage threshold source 212. Fourth voltage threshold source 216 may introduce the voltage such that fourth comparator 214 is able to compare the signal voltage at DP 140 with the additional threshold voltage against the signal voltage at DM 150. Fourth voltage threshold source 216 may be adjustable, such that tolerance for which fourth comparator 214 detects a large enough difference to merit a change in output may be customized. In certain embodiments, fourth comparator 214 may inherently be able to compare the signal voltage at DM 150 against the signal voltage at DP 140 without the use of fourth voltage threshold source 216. The threshold in fourth comparator 214, in this embodiment, may be adjustable.

First buffer 218, second buffer 220, third buffer 222, and fourth buffer 224 (collectively, the buffers)) may be any type of component or circuit that may provide a gain to an input. In particular, the buffers may amplify the signal coming across it. In addition, the buffers may be delay-adjustable. A delay-adjustable buffer may intentionally introduce a delay in the signal across the buffer. An adjustable delay can optimize the timing of DC loss compensation and improve the signal integrity of the eye diagram.

The output of first voltage threshold comparator 201 is coupled to a first input of first NOR gate 226 through, in some embodiments, first buffer 218. Similarly, the output of second voltage threshold comparator 205 is coupled to a second input of first NOR gate 226 through, in some embodiments, second buffer 220.

The output of first NOR gate 226 is coupled to a control input for first switch 234. In the illustrated embodiment, the output of first NOR gate 226 is coupled to a control electrode for a transistor that is first switch 234. The output of first NOR gate 226 dictates whether a current from current source 232 is inserted into DP 140, for example, by outputting a HIGH signal. A current is inserted into DP 140 between detection of a rising edge in DP 140 and the detection of a falling edge DP 140. First switch 234 may be any component or circuit that conducts current generated by current source 232 into DP 140. The output of first NOR gate 226 may also be coupled to a first input of third NOR gate 230.

The output of third voltage threshold comparator 209 is coupled to a first input of second NOR gate 228 through, in some embodiments, third buffer 222. In certain embodiments, second NOR gate 228 is a second logic circuit. Similarly, the output of fourth voltage threshold comparator 213 is coupled to a second input of second NOR gate 228 through, in some embodiments, fourth buffer 224.

The output of second NOR gate 228 is coupled to a control input for second switch 236. In the illustrated embodiment, the output of second NOR gate 228 is coupled to a control electrode for a transistor that is second switch 236. The output of second NOR gate 228 dictates whether a current from current source 232 is inserted into DM 150, for example, by outputting a HIGH signal. A current is inserted into DM 150 between detection of a rising edge in DM 150 and the detection of a falling edge DM 150. Second switch 236 may be any component or circuit that conducts current generated by current source 232 into DM 150. The output of second NOR gate 228 may also be coupled to a second input of third NOR gate 230.

The output of first NOR gate 226 is coupled to a first input of third NOR gate 230 and the output of second NOR gate 228 is coupled to a second input of third NOR gate 230. The output of third NOR gate 230 is coupled to a control input for third switch 238. In the illustrated embodiment, the output of third NOR gate 230 is coupled to a control electrode for transistor that is third switch 238. A first channel electrode (e.g., drain) may be coupled to current source 232, and a second channel electrode (e.g., source) may be coupled to load resistor 240. Load resistor 240 may further be coupled to ground. The output of third NOR gate 230 dictates whether a current from current source 232 is grounded, and therefore not inserted into DP 140 or DM 150. Third switch 238 may be any component or circuit that prohibits current generated by current source 232 from entering into DP 140 and/or DM 150.

The NOR gates (e.g., first NOR gate 226, second NOR gate 228, and third NOR gate 230) are types of basic logic with typically two or more inputs and an output. For example, a NOR gate may output HIGH only when both inputs are LOW. On the other hand, a NOR gate my output LOW when any input is HIGH. While the disclosure illustrates and discusses the NOR gates as a simple logic gate, the disclosure encompasses various circuit and component designs and variations of the logic gate that result in a similar logic table as the illustrated NOR gate.

While the disclosure illustrates and utilizes NOR gates, the disclosure encompasses various circuit and component designs and variations of the logic gate that result in a similar logic table as the illustrated NOR gates.

Figure 3:
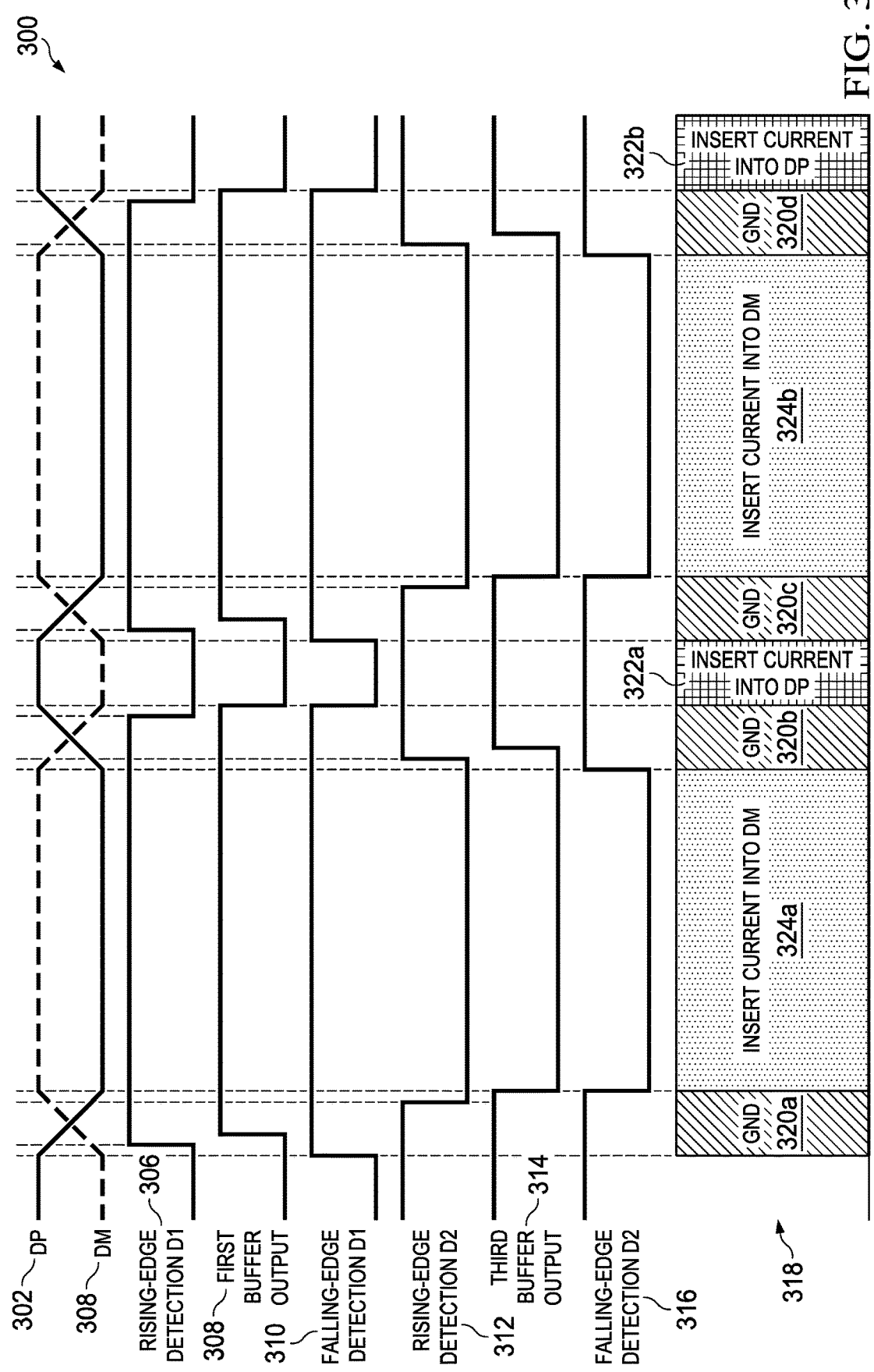
FIG. 3 illustrates an example signal diagram for injecting current in either a positive data line or a negative data line by a DC loss compensation circuit.

FIG. 3 illustrates an example signal diagram 300 for injecting current in either DP 140 or DM 150 by DC loss compensation circuit 130.

DP signal 302 represents a voltage across DP 140. Similarly, DM signal 304 represents a voltage across DM 150. DP signal 302 and DM signal 304 are stabilized at either current i or ground. Consequently, during a stabilized period, DP signal 302 and DM signal 304 are affected by the resistive components across the communication path when either signals are transmitting a current i. On the other hand, the resistive components will not affect DP signal 302 or DM signal 304 when the signal is at ground.

Rising edge detection D1 306 represents an output of first voltage threshold comparator 201 in relation to DP signal 302 and DM signal 304. When DP signal 302 is above DM signal 304 by a voltage threshold, rising edge detection D1 306 goes LOW. On the other hand, when DP signal 302 is not above DM signal 304 by a voltage threshold, rising edge detection D1 306 goes HIGH.

First Buffer Output 308 represents an output of first buffer 218. As illustrated, the output of first buffer 218 may be a time-delayed signal of the output of first voltage threshold comparator 201.

Falling edge detection D1 310 represents an output of second voltage threshold comparator 205 in relation to DP signal 302 and DM signal 304. When DP signal 302 is above DM signal 304 by a voltage threshold, falling edge detection D1 310 goes LOW. On the other hand, when DP signal 302 is not above DM signal 304 by a voltage threshold, falling edge detection D1 310 goes HIGH.

Rising edge detection D2 312 represents an output of third voltage threshold comparator 209 in relation to DP signal 302 and DM signal 304. When DM signal 304 is above DP signal 302 by a voltage threshold, rising edge detection D2 312 goes LOW. On the other hand, when DM signal 304 is not above DP signal 302 by a voltage threshold, rising edge detection D2 312 goes HIGH.

Third Buffer Output 314 represents an output of third buffer 222. As illustrated, the output of third buffer 222 may be a time-delayed signal of the output of third voltage threshold comparator 209.

Falling edge detection D2 316 represents an output of fourth voltage threshold comparator 213 in relation to DP signal 302 and DM signal 304. When DM signal 304 is above DP signal 302 by a voltage threshold, falling edge detection D2 316 goes LOW. On the other hand, when DM signal 304 is not above DP signal 302 by a voltage threshold, falling edge detection D2 316 goes HIGH.

Graph 318 indicates periods of DC loss compensation circuit 130 grounding current source 232 (i.e., GND 320a-d), injecting current into DP 140 (i.e., Insert Current into DP 322a-b), and injecting current into DM 150 (i.e., Insert Current into DM 324a-b).

The periods of GND 320a-d represent periods that the current from current source 232 is grounded by third switch 238. In the illustrated embodiment, GND 320a-d occur during periods when (1) First Buffer Output 308 is HIGH and Falling Edge Detection D2 316 is HIGH and (2) Third Buffer Output 314 is HIGH or Falling Edge Detection D1 310 is HIGH. For example, GND 320a starts when Falling Edge Detection D1 310 goes HIGH and stops when Third Buffer Output 314 goes LOW. As another example, GND 320b starts when Falling Edge Detection D2 316 goes HIGH and stops when First Buffer Output 308 goes LOW.

The periods of Insert Current into DP 322*a-b* represent periods that current from current source 232 is injected to DP 140 via first switch 234. Insert Current into DP 322-*b* occur during periods when both First Buffer Output 308 and Falling Edge Detection D1 310 are LOW and stops when either First Buffer Output 308 or Falling Edge Detection D1 310 goes back to HIGH. For example, Insert Current into DP 322 occurs when both First Buffer Output 308 and Falling Edge Detection D1 310 are LOW and stops when Falling Edge Detection D1 310 goes back to HIGH. As another example, Insert Current into DP 322 occurs when both First Buffer Output 308 and Falling Edge Detection D1 310 are LOW.

The periods of Insert Current into DM 324*a-b* represent periods that current from current source 232 is injected to DM 150 via second switch 236. Insert Current into DM 324-*b* occur during periods when both Third Buffer Output 314 and Falling Edge Detection D2 316 are LOW and stops when Falling Edge Detection D2 316 goes back to HIGH. For example, Insert Current into DM 324*a* occurs when both Third Buffer Output 314 and Falling Edge Detection D2 316 and stops when either Third Buffer Output 314 or Falling Edge Detection D2 316 goes back to HIGH. As another example, Insert Current into DM 324*b* occurs when both Third Buffer Output 314 are LOW and Falling Edge Detection D2 316 are LOW and stops when Falling Edge Detection D2 316 goes back to HIGH.

Figure 4:
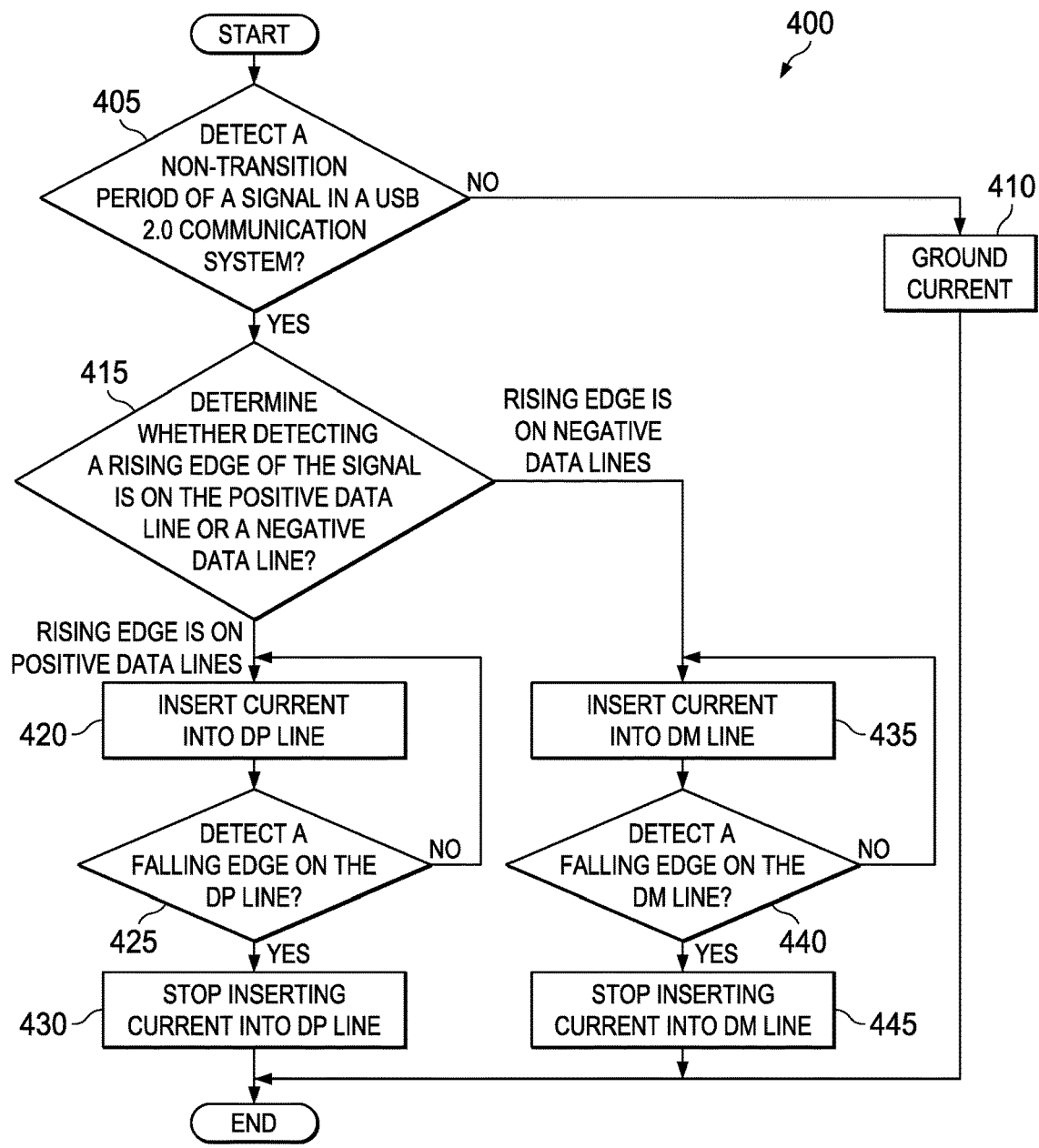
FIG. 4 illustrates an example method for injecting current in either a positive or negative data line by a DC loss compensation circuit.

FIG. 4 illustrates an example method 400 for injecting current in either DP 140 or DM 150 by DC loss compensation circuit 130. The method may begin at step 405, where DC loss compensation circuit 130 detects a non-transition period of a signal in a USB 2.0 communication system. In particular, DC compensation law circuit may detect a rising edge of the signal and/or a falling edge of the signal on DP 140 and DM 150. In response to detecting a non-transition period, the method moves to Step 415. Alternatively, in response to detecting a transition period, the method moves to Step 410.

At Step 410, DC loss compensation circuit 130 does not inject current into DP 140 and/or DM 150, and, instead, grounds any potential outgoing current. The level of current during a transition period typically does not get impacted by the addition of resistive components. Moreover, to keep the signal integrity during the transition periods, DC loss compensation circuit 130 may display high impedance, thereby allowing minimal or no current into DC loss compensation circuit 130.

However, if DC loss compensation circuit 130 detects a non-transition period, DC loss compensation circuit 130 then determines whether the detection is a rising edge of DP 140 or a rising edge of DM 150 at Step 415. If DC loss compensation circuit 130 detects a rising edge of DP 140, the method moves to Step 420. Alternatively, if DC loss compensation circuit 130 detects a rising edge of DM 150, the method moves to Step 435.

At Step 420, when DC loss compensation circuit 130 detects a rising edge of DP 140, DC loss compensation circuit 130 injects current into DP 140. In particular, DC loss compensation circuit 130 may inject a current into DP 140 between detection of a rising edge of a signal on DP 140 and the detection of a falling edge of the signal on DP 140.

At Step 425, DC loss compensation circuit 130 determines whether a detection of a falling edge on DP 140 has occurred. If so, the method moves to 430. Otherwise, the method continues to inject current into DP 140 at Step 420.

At Step 430, DC loss compensation circuit 130 stops inserting current into DP 140 when DC loss compensation circuit 130 detects a falling edge on DP 140. Instead, DC loss compensation circuit 130 may ground the current generated from current source 232. In certain embodiments, DC loss compensation circuit 130 may inject a current into DP 140 between detection of a rising edge of a signal on DP 140 and the detection of a falling edge of the signal on DP 140.

If DC loss compensation circuit 130 detects a rising edge of DM 150 in Step 415, DC loss compensation circuit 130 injects current into DM 150. In particular, DC loss compensation circuit 130 may inject a current into DM 150 between detection of a rising edge of a signal on DM 150 and the detection of a falling edge of the signal on DM 150.

At Step 440, DC loss compensation circuit 130 determines whether a detection of a falling edge on DM 150 has occurred. If so, the method moves to 440. Otherwise, the method continues to inject current into DM 150 at Step 435.

At Step 445, DC loss compensation circuit 130 stops inserting current into DM 150 when DC loss compensation circuit 130 detects a falling edge on DM 150. Instead, DC loss compensation circuit 130 may ground the current generated from current source 232. In certain embodiments, DC loss compensation circuit 130 may inject a current into DM 150 between detection of a rising edge of a signal on DM 150 and the detection of a falling edge of the signal on DM 150.

Particular embodiments may repeat one or more steps of the method of FIG. 4, where appropriate. Although this disclosure describes and illustrates particular steps of the method of FIG. 4 as occurring in a particular order, this disclosure contemplates any suitable steps of the method of FIG. 4 occurring in any suitable order. Moreover, although this disclosure describes and illustrates an example method for injecting current in either DP 140 or DM 150 by DC loss compensation circuit 130 including the particular steps of the method of FIG. 4, this disclosure contemplates any suitable method for injecting current in either DP 140 or DM 150 by DC loss compensation circuit 130 including any suitable steps, which may include all, some, or none of the steps of the method of FIG. 4, where appropriate. Furthermore, although this disclosure describes and illustrates particular components, devices, or systems carrying out particular steps of the method of FIG. 4, this disclosure contemplates any suitable combination of any suitable components, devices, or systems carrying out any suitable steps of the method of injecting current in either DP 140 or DM 150 by DC loss compensation circuit 130.

The present disclosure may also be a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture ("ISA") instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). In some embodiments, electronic circuitry including, for example, programmable logic circuitry, field-programmable gate arrays ("FPGA"), or programmable logic arrays ("PLA") may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit ("ASIC"), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit ("CPU"), an integrated circuit ("IC"), a graphics processing unit ("GPU"), etc.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction.

As used herein, channel electrode means an element of a device that carries current through the device such as a source or a drain of a metal-oxide-semiconductor field-effect transistor ("MOSFET") or an emitter or a collector of a bipolar transistor, and a control electrode means an element of the device that controls current through the device such as a gate of a MOSFET or a base of a bipolar transistor. Moreover, terms such as coupled to or couples with (and the like) are intended to describe either an indirect or direct electrical connection. Thus, if a first device couples to a second device, that connection can be made through a direct electrical connection, or through an indirect electrical connection via other devices and/or connections.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A USB 2.0 system comprising:
current source;
a first switch;
a second switch;
a first voltage threshold comparator;
a second voltage threshold comparator;
a third voltage threshold comparator;
a fourth voltage threshold comparator;
a first logic circuit;
a second logic circuit;
the current source is coupled to a channel input of the first switch and a channel input of the second switch;
an output of the first switch is coupled to a positive data line in a USB 2.0 communication system;
an output of the second switch is coupled to a negative data line in the USB 2.0 communication system;
a first input of the first voltage threshold comparator is coupled to the negative data line, a second input of the first voltage threshold comparator is coupled to the positive data line, and an output of the first voltage threshold comparator is coupled to a first input of the first logic circuit;
a first input of the second voltage threshold comparator is coupled to the negative data line, a second input of the second voltage threshold comparator is coupled to the positive data line, and an output of the second voltage threshold comparator is coupled to a second input of the first logic circuit;
an output of the first logic circuit is coupled to a control input of the first switch;
a first input of the third voltage threshold comparator is coupled to the positive data line, a second input of the third voltage threshold comparator is coupled to the negative data line, and an output of the third voltage threshold comparator is coupled to a first input of the second logic circuit;
a first input of the fourth voltage threshold comparator is coupled to the positive data line, a second input of the fourth voltage threshold comparator is coupled to the negative data line, and an output of the fourth voltage threshold comparator is coupled to a first input of the second logic circuit; and
an output of the second logic circuit is coupled to a control input of the second switch.

2. A USB 2.0 system comprising:
a current source;
a transistor having a first channel terminal, a second channel terminal, and a control terminal;
a voltage threshold comparator;
the current source is coupled to the first channel terminal of the transistor;
the second channel terminal of the transistor is coupled to a positive or negative data line in a USB 2.0 communication system;
a first input of the voltage threshold comparator is coupled to the negative data line, a second input of the voltage threshold comparator is coupled to a positive data line, and an output of the voltage threshold comparator is coupled to the control terminal of the transistor.

3. The system of claim 2, wherein:
the voltage threshold comparator is an operational amplifier;
the first input of the voltage threshold comparator is a non-inverting input; and
the second input of the first voltage threshold comparator is an inverting input.

4. The system of claim 2, wherein the voltage threshold comparator is a first voltage threshold comparator, the first voltage threshold comparator is coupled to the first channel terminal of the transistor through a logic circuit, wherein the output of the first voltage threshold comparator is coupled to a first input of the logic circuit and the output of the logic circuit is coupled to the control electrode of the transistor; and further comprising:
a second voltage threshold comparator; and
a first input of the second voltage threshold comparator receiving the negative data line, a second input of the second voltage threshold comparator receiving a positive data line, and an output of the second voltage threshold comparator coupled to a second input of the logic circuit.

5. The system of claim 2, wherein:
the transistor is a first switch;

the output of the first switch is coupled to the positive data line; and the voltage threshold comparator is a first comparator; and further comprising:
- a second switch;
- a channel input of the second switch is coupled to the current source;
- an output of the second switch coupled to the negative data line;
- a second voltage threshold comparator; and
- a first input of the second voltage threshold comparator is coupled to the positive data line, a second input of the second voltage threshold comparator receiving a negative data line, and an output of the second voltage threshold comparator coupled to a control input of the second switch.

6. The system of claim 5, further comprising:
a third switch;
a logic circuit;
a channel input of the third switch coupled to the current source, a control input of the third switch coupled to an output of the logic circuit, and an output of the third switch is coupled to ground; and
a first input of the logic circuit is coupled to the output of the first voltage threshold comparator and a second input of the logic circuit is coupled to the output of the second voltage threshold comparator.

7. The system of claim 2, wherein the output of the voltage threshold comparator is coupled to the control electrode of the transistor via a buffer.

* * * * *